(12) United States Patent
Carre et al.

(10) Patent No.: US 9,847,243 B2
(45) Date of Patent: Dec. 19, 2017

(54) DEBONDING A GLASS SUBSTRATE FROM CARRIER USING ULTRASONIC WAVE

(75) Inventors: Alain Robert Emile Carre, Le Chatelet-en-Brie (FR); Sean Matthew Garner, Elmira, NY (US); Jean Waku-Nsimba, La Brosse-Montceaux (FR)

(73) Assignee: Corning Incorporated, Corning, NY (US)

( * ) Notice: Subject to any disclaimer, the term of this patent is extended or adjusted under 35 U.S.C. 154(b) by 1220 days.

(21) Appl. No.: 12/548,685

(22) Filed: Aug. 27, 2009

(65) Prior Publication Data

US 2011/0048611 A1    Mar. 3, 2011

(51) Int. Cl.
*B32B 37/02* (2006.01)
*H01L 21/683* (2006.01)
*B32B 43/00* (2006.01)

(52) U.S. Cl.
CPC ...... *H01L 21/6835* (2013.01); *H01L 21/6836* (2013.01); *B32B 43/006* (2013.01); *H01L 2221/6835* (2013.01); *H01L 2221/68327* (2013.01); *H01L 2221/68381* (2013.01); *H01L 2221/68395* (2013.01); *H01L 2924/19041* (2013.01)

(58) Field of Classification Search
CPC ............... B32B 43/006; H01L 21/6835; H01L 21/6836; H01L 2221/68327; H01L 2221/68381; H01L 2221/68395; H01L 2924/19041
USPC ....................................................... 156/73.1
See application file for complete search history.

(56) References Cited

U.S. PATENT DOCUMENTS

| 724,331 | A | | 3/1903 | Raymond et al. |
| 5,091,331 | A | | 2/1992 | Delgado et al. ................. 437/62 |
| 5,281,560 | A | | 1/1994 | Francis et al. .................. 501/15 |
| 5,362,226 | A | * | 11/1994 | Kataoka et al. .............. 425/526 |
| 5,854,123 | A | | 12/1998 | Sato et al. ..................... 438/507 |
| 5,882,532 | A | | 3/1999 | Field et al. ....................... 216/2 |
| 5,904,505 | A | * | 5/1999 | Hotta et al. ................... 438/124 |
| 6,054,363 | A | | 4/2000 | Sakaguchi et al. ........... 438/406 |
| 6,100,166 | A | | 8/2000 | Sakaguchi et al. ........... 438/455 |
| 6,127,199 | A | | 10/2000 | Inoue et al. ..................... 438/30 |
| 6,143,628 | A | | 11/2000 | Sato et al. ..................... 438/455 |
| 6,277,502 | B1 | * | 8/2001 | Buchecker et al. .......... 428/689 |

(Continued)

FOREIGN PATENT DOCUMENTS

| CN | 1645591 | | 7/2005 |
| CN | 1645591 | A | 4/2009 |

(Continued)

OTHER PUBLICATIONS

State Intellectual Property Office of the People's Republic of China; First Office Action; dated Feb. 25, 2014; pp. 1-3.

*Primary Examiner* — Philip Tucker
*Assistant Examiner* — Vicki Wu
(74) *Attorney, Agent, or Firm* — Jeffrey A. Schmidt

(57) ABSTRACT

A process for making a device comprising a thin functional substrate comprising bonding the functional substrate to a carrier substrate, forming functional components on the functional subsrate, and debonding the functional substrate from the carrier substrate by applying ultrasonic wave to the bonding interface. The application of ultrasonic wave aids the debonding step by reducing the tensile stress the functional substrate may experience.

25 Claims, 3 Drawing Sheets

(56) References Cited

U.S. PATENT DOCUMENTS

| | | | |
|---|---|---|---|
| 6,337,288 B1 * | 1/2002 | Ohya et al. | 438/758 |
| 6,342,433 B1 | 1/2002 | Ohmi et al. | 438/455 |
| 6,375,738 B1 | 4/2002 | Sato | 117/89 |
| 6,376,332 B1 | 4/2002 | Yanagita et al. | 438/458 |
| 6,455,152 B1 * | 9/2002 | DiZio et al. | 428/345 |
| 6,521,511 B1 | 2/2003 | Inoue et al. | 438/458 |
| 6,555,443 B1 | 4/2003 | Artmann et al. | 438/458 |
| 6,558,493 B1 * | 5/2003 | Ledger et al. | 156/98 |
| 6,566,235 B2 * | 5/2003 | Nishida et al. | 438/458 |
| 6,664,169 B1 * | 12/2003 | Iwasaki et al. | 438/409 |
| 6,696,325 B1 | 2/2004 | Tsai et al. | 438/149 |
| 6,884,726 B2 | 4/2005 | Gardes | 438/694 |
| 6,913,971 B2 | 7/2005 | Aspar et al. | 438/256 |
| 6,936,523 B2 | 8/2005 | Berne et al. | 438/458 |
| 6,939,782 B2 | 9/2005 | Aspar et al. | 438/455 |
| 6,946,361 B2 | 9/2005 | Takayama et al. | 438/455 |
| 6,991,995 B2 | 1/2006 | Aulnette et al. | 438/458 |
| 7,045,438 B2 | 5/2006 | Yamazaki et al. | 438/455 |
| 7,060,590 B2 | 6/2006 | Bressot et al. | 438/455 |
| 7,084,045 B2 | 8/2006 | Takayama et al. | 438/455 |
| 7,091,108 B2 | 8/2006 | Tolchinsky et al. | 438/458 |
| 7,122,444 B2 | 10/2006 | Nakata et al. | 438/455 |
| 7,122,445 B2 | 10/2006 | Takayama et al. | 438/458 |
| 7,147,740 B2 | 12/2006 | Takayama et al. | 156/235 |
| 7,166,520 B1 | 1/2007 | Henley | 438/458 |
| 7,189,632 B2 | 3/2007 | Kerdiles et al. | 438/458 |
| 7,211,168 B2 | 5/2007 | Miyanari | 156/344 |
| 7,223,672 B2 | 5/2007 | Kazalas et al. | 438/458 |
| 7,235,462 B2 | 6/2007 | Letertre et al. | 438/455 |
| 7,241,666 B2 | 7/2007 | Goto et al. | 438/455 |
| 2002/0014465 A1 | 2/2002 | Chung | 211/126.1 |
| 2002/0106869 A1 | 8/2002 | Otsu et al. | 438/459 |
| 2005/0001201 A1 | 1/2005 | Bocko et al. | 252/299.01 |
| 2005/0029224 A1 | 2/2005 | Aspar et al. | 216/33 |
| 2005/0129909 A1 | 6/2005 | Hermens et al. | 428/138 |
| 2005/0136625 A1 | 6/2005 | Henseler et al. | 438/479 |
| 2005/0173064 A1 | 8/2005 | Miyanari | 156/344 |
| 2005/0272222 A1 | 12/2005 | Flamand et al. | 438/458 |
| 2006/0028014 A1 * | 2/2006 | McQueeny et al. | 283/101 |
| 2006/0205180 A1 * | 9/2006 | Henley et al. | 438/458 |
| 2007/0145602 A1 | 6/2007 | Yang | 257/777 |
| 2007/0148409 A1 * | 6/2007 | Rios et al. | 428/167 |
| 2008/0132033 A1 | 6/2008 | Eguchi et al. | 438/460 |

FOREIGN PATENT DOCUMENTS

| | | | |
|---|---|---|---|
| DE | 10032283 | 1/2002 | B26F 3/06 |
| DE | 10339998 | 1/2002 | H01L 21/58 |
| DE | 10323303 A1 * | 4/2004 | |
| DE | 10339998 B3 * | 1/2005 | |
| EP | 867919 | 9/2004 | H01L 21/20 |
| EP | 1628339 | 2/2006 | H01L 21/762 |
| JP | 2003-085965 | 3/2003 | |
| JP | 2005/79553 A | 3/2005 | |
| JP | 2009-186916 | 8/2009 | |
| WO | WO0247136 | 6/2002 | H01L 21/20 |
| WO | WO03081664 | 10/2003 | H01L 21/68 |
| WO | WO2004032593 | 4/2004 | |
| WO | WO2006033822 | 3/2006 | H01L 51/40 |
| WO | WO2006093817 | 9/2006 | |

* cited by examiner

7A

7B

DEBONDING A GLASS SUBSTRATE FROM CARRIER USING ULTRASONIC WAVE

TECHNICAL FIELD

The present invention relates to methods and apparatuses for making devices based on a thin substrate. In particular, the present invention relates to methods and apparatuses for making devices on a surface of a thin substrate supported by a carrier substrate. The present invention is useful, for example, in the manufacture of optoelectronic devices, such as display devices, on the surface of a thin, flexible glass substrate having a thickness lower than 500 μm using a carrier substrate.

BACKGROUND

Traditional TFT LCD displays are manufactured by forming thin-film semiconductor transistors on the surfaces of glass substrates. The prevailing thickess of the glass substrates used is about 500-700 μm. Significant capital investment has been made by LCD panel makers on the production lines for these relatively thick glass substrates.

There is a growing trend that the glass substrates underlying the TFT devices are becoming thinner and lighter. Glass substrates having a thickness lower than 500 μm, such as 300 μm, 100 μm or even thinner, can be desirable for certain display applications, especially for portable devices such as laptop computers, hand-held devices and the like. One way to achieve such low thickness in the device is to first fabricate a device based on a thicker glass substrate, followed by chemical and/or mechanical thinning of the substrate. While this process is effective, it would be desirable to fabricate the device directly on a thin substrate, thus eliminating the step of thinning However, handling of such thin glass substrates presents a significant technical challenge for the panel makers because many of the production lines were not designed to have the capability to process such significantly thinner glass substrates without significant process modification.

One proposed modification to the conventional process for thick glass substrates is to bond the thin glass substrates to a carrier glass substrate by using a bonding agent such as an adhesive compatible with the down-stream process steps. The larger combined thickness of the bonded substrates can solve the handling issues on conventional TFT fabrication lines.

Upon formation of the semiconductor devices on the surface of thin, functional glass substrate supported by the carrier substrate, the functional substrate needs to be released from the carrier susbstrate. However, it is not a trivial matter to effect the debonding without causing damage to the functional substrate and/or devices formed thereon.

Thus, there is a need of an effective method for debonding a thin functional substrate from a carrier substrate.

The present invention satisfies this and other needs.

SUMMARY

Several aspects of the present invention are disclosed herein. It is to be understood that these aspects may or may not overlap with one another. Thus, part of one aspect may fall within the scope of another aspect, and vice versa.

Each aspect is illustrated by a number of embodiments, which, in turn, can include one or more specific embodiments. It is to be understood that the embodiments may or may not overlap with each other. Thus, part of one embodiment, or specific embodiments thereof, may or may not fall within the ambit of another embodiment, or specific embodiments thereof, and vice versa.

The present disclosure is directed to a process for making a device comprising a thin functional substrate having a first surface, a second surface opposite the first surface, and a thickness T1 between the first surface and the second surface, comprising the following steps:

(A) bonding the first surface of the functional substrate to a carrier substrate having a thickness T2 by using a layer of a bonding agent at the bonding interface;

(B) processing the second surface of the functional substrate; and (C) releasing the carrier substrate from the functional substrate by applying an ultrasonic wave to the bonding interface.

In certain embodiments of the process of the present disclosure, T2>T1.

In certain embodiments of the process of the present disclosure, T1≤500 μm.

In certain embodiments of the process of the present disclosure, in step (B), a functional component is formed on the second surface of the functional substrate.

In certain embodiments of the process of the present disclosure, both the functional substrate and the carrier substrate comprise glass materials.

In certain embodiments of the process of the present disclosure, the bonding agent used in step (A) comprises at least one of a silicone adhesive and a perfluoro elastomer.

In certain embodiments of the process of the present disclosure, the layer of the bonding agent is an elastomer having (a) a Shore A hardness in the range of 10 to 90; and (b) a roughness of at most 183 nanometers.

In certain embodiments of the process of the present disclosure, the bond between the carrier substrate and the layer of the bonding agent has a peel strength of at least 0.5 kilonewtons/meter when measured at a peeling speed of 20 millimeters/minute and a peeling angle of 90°.

In certain embodiments of the process of the present disclosure, in step (C), the ultrasonic wave is applied to the bonding interface through a liquid bath.

In certain embodiments of the process of the present disclosure, in step (C), the ultrasonic wave is applied to the bonding interface through a liquid bath comprising an organic solvent having a surface tension lower than water at 20° C. such as ethanol.

In certain embodiments of the process of the present disclosure, in step (C), the ultrasonic wave is applied to the bonding interface through a transducer.

In certain embodiments of the process of the present disclosure, in step (C), the ultrasonic wave is applied to the peripheral area of the bonding interface between the functional substrate and the carrier substrate.

In certain embodiments of the process of the present disclosure, in step (C), the ultrasonic wave is applied at a greater power to the peripheral area than to the central area of the bonding interface between the carrier substrate and the functional substrate.

In certain embodiments of the process of the present disclosure, step (C) further comprises, after applying the ultrasonic wave to the bonding interface, peeling the functional substrate away from the carrier substrate.

In certain embodiments of the process of the present disclosure, during the step of peeling the functional substrate away from the carrier substrate, the peeling radius is at least 5 cm, in certain embodiments at least 10 cm, in certain other embodimens at least 20 cm, in certain other embodiments at least 30 cm.

In certain embodiments of the process of the present disclosure, the step of peeling the functional substrate away from the carrier substrate comprises using a debonding roller.

In certain embodiments of the process of the present disclosure, the functional substrate has a thickness T1 of at most 400 μm, in certain embodiments at most 300 μm; in certain embodiments at most 200 μm, in certain embodiments at most 100 μm, in certain embodiments at most 50 μm.

In certain embodiments of the process of the present disclosure, in step (A), the layer of the bonding agent at the bonding interface has a thickness of at most 300 μm, in certain embodiments at most 200 μm, in certain other embodiments at most 150 μm, in certain other embodiments at most 100 μm, in certain embodiments from 1 μm to 80 μm, in certain embodiments from 5 μm to 60 μm, in certain embodiments from 10 μm to 50 μm.

In certain embodiments of the process of the present disclosure, in step (C), the ultrasonic wave is applied such that the functional component formed in step (B) is not damaged.

In certain embodiments of the process of the present disclosure, in step (C), the ultrasonic wave is chosen to have a frequency in the range from 20 to 400 kHz, and a power in the range from 0.1 to 500 watt.

In certain embodiments of the process of the present disclosure, wherein in step (C), the ultrasonic wave is applied with substantially uniform power to the bonding interface between the carrier substrate and the functional substrate.

In certain embodiments of the process of the present disclosure, the layer of the bonding agent has a stronger adhesion to the carrier substrate than to the functional substrate.

In certain embodiments of the process of the present disclosure, at the end of step (C), the carrier substrate remains bonded to the layer of the bonding agent.

In certain embodiments of the process of the present disclosure, step (A) comprises:

(A01) applying a pre-polymerization layer of the bonding agent on a surface of the carrier substrate; and subsequently (A02) polymerizing the pre-polymerization layer to obtain a polymerized layer of the bonding agent bonded to the carrier substrate; and (A03) placing the first surface of the functional substrate over the polymerized layer of bonding agent to achieve a bond with the functional substrate that is weaker than the bond between the bonding agent and the carrier substrate.

In certain embodiments of the process of the present disclosure, step (A) comprises:

(A11) forming a first layer of a first coating over a surface of the carrier substrate;

(A12) applying the bonding agent between the first layer of the first coating and the first surface of the functional substrate.

In certain embodiments of the process of the present disclosure, in step (A11), the first layer of the first coating comprises a silane.

In certain embodiments of the process of the present disclosure, the functional substrate comprise multiple layers of glass and polymer such as polyimide.

In certain embodiments of the process of the present disclosure, after step (C), the carrier substrate bonding to the layer of bonding agent is reused in a cycle of processing another functional substrate.

One or more embodiments of the process of the pesent disclosure have the following advantages.

Use of an ultrasonic de-bonding method enables the use of a thin glass substrate within display manufacturer's current equipment and fabrication conditions. Thin glass substrates are more susceptible to breakage due to bend stresses than plastic and stainless steel substrates are. Use of an ultrasonic de-bonding approach minimizes substrate bend stress that would otherwise have caused mechanical failure in the glass substrate.

The process enables re-use of the carrier substrate after it is cleaned, which reduces the overall cost.

The ultrasonic de-bonding approach is compatible with several bonding methods. The ultrasonic approach is able to release the substrate from the carrier without undue detrimental effect on the functional components formed on the surface of the functional substrate as long as the substrate-carrier bond is the weakest in the overall structure. The ultrasonic release of the substrate can be done in parallel over a large area.

This processing method eliminates or reduces the need of fabricating displays on 0.5 mm thick glass and HF etching or polishing the substrates down to <0.3 mm thicknesses. This creates a more environmentally friendly method in terms of HF use and disposal.

Use of this ultrasonic de-bonding approach preserves (does not degrade) the inherent edge strength of the glass substrate. This de-bonding approach minimizes breakage and damage of the glass substrate edges and therefore minimizes mechanical failure in the display manufacturer's facility.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that the foregoing general description and the following detailed description are merely exemplary of the invention, and are intended to provide an overview or framework to understanding the nature and character of the invention as it is claimed.

The accompanying drawings are included to provide a further understanding of the invention, and are incorporated in and constitutes a part of this specification.

DETAILED DESCRIPTION

Figure 1:
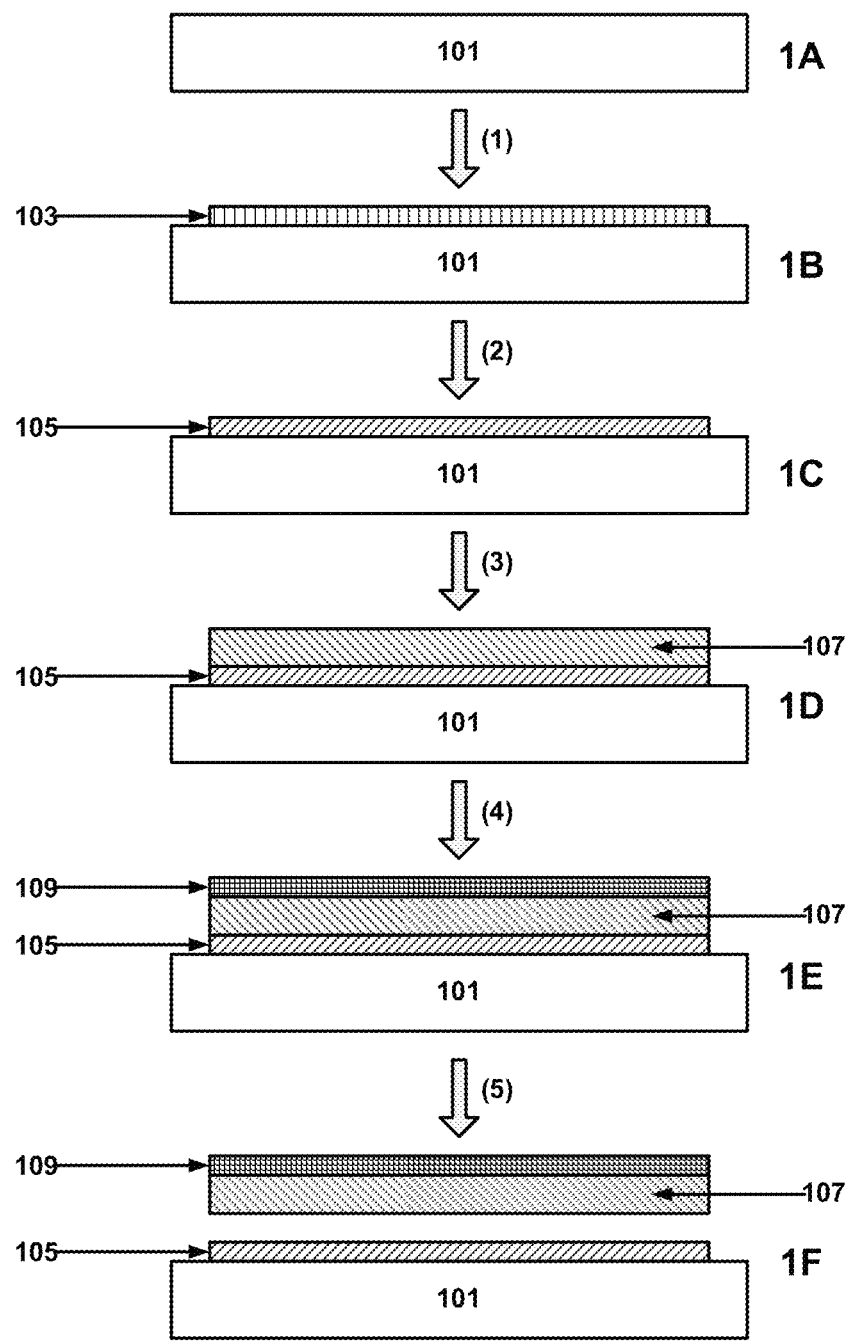
FIG. 1 is a schematic illustration of the process according to one embodiment of the present disclosure for fabricating a TFT display.

Unless otherwise indicated, all numbers such as those expressing weight percents of ingredients, dimensions, and values for certain physical properties used in the specification and claims are to be understood as being modified in all instances by the term "about." It should also be understood that the precise numerical values used in the specification and claims form additional embodiments of the invention. Efforts have been made to ensure the accuracy of the numerical values disclosed in the Examples. Any measured numerical value, however, can inherently contain certain errors resulting from the standard deviation found in its respective measuring technique.

As used herein, in describing and claiming the present invention, the use of the indefinite article "a" or "an" means "at least one," and should not be limited to "only one" unless explicitly indicated to the contrary. Thus, for example, reference to "a bonding agent" includes embodiments having two or more such bonding agents, unless the context clearly indicates otherwise.

The present invention can be advantageously applied to the fabrication of an optoelectronic device based on a glass substrate, such as a conventional TFT display device. However, one having ordinary skill in the art, upon reading the present disclosure, with the benefit of the teaching herein, should readily understand that the present invention may be applied to the fabrication of other devices, such as devices based on metal or organic substrates, as long as a debonding step involving the use of a bonding agent between two substrates is needed in the fabrication process. The present disclosure will be hereinafter further illustrated in the context of fabrication of a TFT display device, even though the present invention as claimed shall not be limited to such process only.

There is a growing interest in portable display products that are thinner and lighter in weight, such as those having a glass substrate with a thickness of at most 500 µm, including 400 µm, 300 µm, and the like. It is highly desirable to manufacture such products on production lines designed mainly for handling thicker glass substrates (such as those at about 700 µm thickness), to reduce the high captical investment required for developing and installing production lines specifically suited for thin glass substrates.

One approach is to fabricate standard displays on 500 µm to 700 µm thick glass functional substrates. After the functional devices have been fabricated, either an etching or polishing process is then used to thin the functional substrate down to lower than 500 µm, such as 400 µm, 300 µm, 200 µm or even 100 µm.

To eliminate the thinning step, a carrier-bonding process to temporarily bond the functional substrate to a temporary carrier substrate was proposed. After devices have been fabricated on the functional substrate, the functional substrate is de-bonded from the carrier substrate and the carrier substrate is potentially reused. European Patent Application No. 09305404.7, entitled "Carrier for Glass Substrates" and filed on May 6, 2009, describes such a carrier-bonding process in detail, the relevant parts thereof are relied on and incorporated herein by reference in its entirety.

Different bonding methods, such as using organic based adhesive film, elastomer, direct glass-to-glass bonding, or inorganic adhesion layers could be used. Likewise, several different methods exist for weakening this temporary bond enough to delaminate the functional subtrate. These weakening methods have been optimized for the bonding material and mechanism, but most of the methods proposed require a certain amount of substrate bending. Even if the fabricated device is rigid, some amount of tensile bending stress is created when the functional substrate is peeled or pried off of the carrier substrate. To avoid substrate breakage or detrimental effect on any functional device already formed on the functional substrate, the tensile bending stress caused by the peeling or prying off of the functional substrate from the carrier substrate should be desirably minimized. The method of the present disclosure, by utilizing an ultrasonic wave during the debonding step, can aid to reduce or eliminate the application of bending stress during debonding.

In a typical, conventional TFT device in the display market as of the filing date of the present disclosure, functional components, such as transistors, resistors, inductors, wires, and the like, of an electric circuit are formed over a surface of a high-precision glass substrate. Thus, in the process of the present disclosure, the functional substrate can be a glass substrate. In particularly desirable embodiments, the functional substrate has a thickness of at most 500 µm, such as at 150 µm, 200 µm, 250 µm, 300 µm, 350 µm, 400 µm, and 450 µm. As discussed supra, such thin functional substrates, when combined with a carrier substrate, can benefit from the standard conventional equipment designed and fabricated specifically for thicker substrates, such as those having a thickness of about 600 µm and 700 µm. The composition of the glass functional substrate is not critical for the present invention, as long as it is suitable for making the intended functional components on the suface. The compositions of the following examplary commercial glasses can be suitable for the functional substrate of the present disclosure: Eagle XG® available from Corning Incorporated, Corning, N.Y. (hereinafter "Corning"); Jade® available from Corninig; OA-20 available from Nippon Electric Glass, Japan; and AN-100 available from Asahi, Japan. However, it is not ruled out that the functional substrate may be based on or comprise other materials, for example: organic polymers such as polyesters, polyamides, polyimides, polysulfones, polyethers, polyolfines, and the like; glass-ceramic materials such as those comprising β-spodumene, β-quartz, spinel, or other crystalline phases; ceramic materials such as zirconia, cristobalite; and crystalline materials, such as single crystalline silicon, SiC, GaAs, and the like. The functional substrate may be made of a single homogeneous material, as in the case of a bare glass substrate. In other embodiments, the functional substate, such as a glass substrate, can be coated with any polymer or molecule that can provide desired properties, such as, protection from abrasion, modulation of adhesion and/or reduction of fragility. As examples, perfluorooctadecyltrichlorosilane can be used to modulate the glass adhesion to the elastomer and polyimide coatings 1-50 μm thick can be used to protect the glass surface from contact damage. Still in other embodiments, the functional substrate may have a complex, multi-layered structure, including but not limited to: (i) a sheet material bearing certain optical or electrical components previously built thereon; and (ii) a glass package including two glass sheets sandwiching certain optical or electrical previously built between them.

The carrier can be made of industrial or other lower grade glass substrate that has too high of an inclusion, cord, or streak defect level to be of used as a display substrate. These physical or optical defects do not inhibit its use as a carrier substrate, however. The carrier can also be formed through a fusion, slot, float, or other sheet forming method. The carrier can be either the same area as the functional subtrate or slightly larger. If the carrier is slightly larger, it will protect the functional subtrate from edge impact during the device processing method. For example, the carrier can be slightly over-sized by 5 mm and have its edges finished, rounded or ground to tolerate typical impact experienced in device fabrication equipment. Also the carrier can be a different geometrical shape than the functional subtrate. The functional substrates could also be tiled onto the larger carrier substrate. Also the carrier could have surface features, grooves, or porosity that enable bonding material adhesion or location. By itself the carrier substrate can have the same thickness and stiffness as the functional substrate as long as when adhered together the combined stiffness is compatible with typical processing equipment.

The bonding agent between the functional and the carrier substrates can be, e.g., organic based adhesive film, elastomer, or inorganic adhesion layers, depending on the required process conditions of subsequent steps. Where semiconductor materials and devices sensitive to contaminants are to be formed in down-stream processing of the functional substrate, low outgassing bonding agent is desired. In certain embodiments, the bonding agent layer is advantageously an elastomer, particularly a non-polar elastomer, examples of which include silicone elastomers, fluoro silicone elastomers and perfluoroelastomers. Of these, perfluoroelastomers are particularly well suited for many applications because of their total replacement of hydrogen atoms by fluorine atoms and their ability to achieve perfect cross-linking, which together lead to low levels of outgassing (e.g., no detectable outgassing after a 1 hour soak at 325° C.) and high levels of thermal and chemical stability, e.g., thermal stability up to 400° C. and higher chemical durability than silicones and fluorosilicones. The perfluoroelastomers can exhibit higher bonding energies to glass than silicone elastomers which can be an additional advantage for some applications depending on the composition of functional and carrier substrates.

Silicone elastomers have the advantage that their adhesion levels can be simply adjusted by varying the amount of cross-linker used during curing. However, unreacted cross-linker and/or low molecular weight species in the final product may generate unacceptable levels of outgassing during the manufacture of electronic components. As discussed above, perfluoroelastomers are typically free of outgassing issues.

The bonding agent can be in liquid or substantially solid form when applied to the bonding interface between the functional and carrier substrates. In one exemplary embodiment, the bonding agent can be introduced as a double-sided adhesive tape. In another embodiment, the bonding agent is applied first as a pre-polymerization liquid or solid, and is thereafter subject to polymerization induced by, e.g., thermal or irradiation initiation. Depending on the application, the bonding agent may cover the full surface of the carrier substrate and the first surface of the functional substrate, or a portion thereof. Partial coverage can be used to adjust the bond strength between the bonding agent and the carrier substrate of the functional substrate, or both. Application of a pre-polymerization bonding agent in liquid or solid form can be effected by conventional equipment and process known to one having ordinary skill in the art, such as casting, flow coating, brush coating, spray coating, dip coating, screen printing, and the like.

Depending on the application and the subsequent process conditions, the bonding agent may be (i) first applied to a surface of the carrier substrate, subjected to polymerization, then attached to the first surface of the functional substrate; or (ii) first applied to the first surface of the functional substrate, subjected to polymerization, then attached to a surface of the carrier substrate; or (iii) applied directly to the first surface of the functional substrate and a surface of the carrier substrate simultaneously, followed by polymerization; to effect the desired bonding between the two substrates. In certain embodiments, it is desired that the bonding agent layer has a sufficiently smooth surface in direct contact with the first surface of the functional substrate. To that end, if a pre-polymerization layer of the bonding agent is first applied to a surface of the carrier substrate, it can be covered during polymerization with a smooth, hydrophobized pressing substrate, e.g., a glass sheet that has been hydrophobized by vapor deposition of a thin layer of a perfluorosilane (e.g., perfluorodecyltrichlorosilane). The surface quality of the pressing substrate and the load it exerts on the bonding agent can vary in order to control the thickness and surface roughness of the bonding agent at the end of the polymerization step. In general, if a pre-polymerization layer of the bonding agent is first applied to a suface of the carrier substrate, polymerized subsequently, and then the functional substrate is attached to the polymerized bonding agent layer, a stronger bond between the polymerized bonding agent and the carrier subsrate than between the bonding agent and the functional substrate can be obtained. This is because the bond between the polymerized bonding agent resulting from the polymerization reaction can include covalent bonds, whereas the subsequently formed bond between the functional substrate and the polymerized bonding agent is largely of the van der Waals type.

Depending on the application, the bonding agent may demonstrate a stronger bond with either of the functional and carrier substrates, or substantially the same level of bond with both substrates. However, in certain embodiments, it is particularly desirable that the bonding agent exhibits a stronger bond with the carrier substrate than with the first surface with the functional substrate. In certain embodiments, an adhesion promoter is applied to the surface of the carrier substrate before the bonding agent is applied thereto, in order to achieve the desired level of adhesion between the carrier substrate and the bonding agent. Adhesion can be promoted by varying the vulcanization rate of silicone. See Gent, The Journal of Adhesion, 79, pp 315-325, (2003). For other elastomers, an adhesion promoter may be helpful in achieving the requisite level of bonding. See L. Léger, Macromol. Symp. 149, pp 197-205 (2000). For example, in the case of perfluoroelastomers and a support composed of glass, one or more fluorinated silanes, e.g., FDS (perfluorooctadecyltrichlorosilane), may be used as an adhesion promoter. The fluorinated silane can be vapour-deposited on the glass so that the fluorinated chain will penetrate into the perfluoroelastomer and as a result improve adhesion between the elastomer and the glass support. Such stronger bond with the carrier substrate can lead to a preferential debonding of the functional substrate from the bonding agent and the carrier substrate, facilitating the subsequent handling and processing of the functional substrate. In certain embodiments, it is highly desired and possible that the carrier substrate bearing a layer of the bonding agent is reusable and recyclable for the processing of another functional substrate. In these embodiments, a stronger bond between the bonding agent and the carrier substrate is particularly advantageous. As described supra, such stronger bond with the carrier substrate can be effected by polymerization of the bonding agent upon its application to the surface of the carrier substrate but before it is attached to the functional substrate. On the other hand, where a weaker bond between the carrier substrate and the bonding agent is desired, an adhesion-reducing layer can be applied to the surface of the carrier substrate before the bonding agent is applied thereto.

Depending on the application, the thickness of the bonding agent between the functional and the carrier substrates can vary widely, e.g., it can be in the range of 1 μm to several thousand micrometers, in certain embodiments ats most 1000 μm, such as from 1 μm to 300 μm, from 1 μm to 200 μm, from 1 μm to 100 μm, or from 1 μm to 50 μm. Where the functional substrate has a thickness of lower than 500 μm, and the total thickness of the functional and carrier substrates is less than 1000 μm, it is desired that the bonding agent has a thickness from 1 μm to 200 μm, such as from 1 μm to 100 μm, from 1 μm to 50 μm, from 10 μm to 100 μm, or from 10 μm of 80 μm. The thickness of the bonding agent can be controlled by the amount of the bonding agent applied and the method of application. The Young's modulus of the bonding agent can also be in a broad range. For example, it can be on the order of 1 to 10 MPa, e.g., on the order of 1 to 5 MPa.

Shore A hardness is a normalized test used to measure the hardness of soft materials. Like other hardness tests, an indentor penetrates the material under a given force, and the indentation depth (i.e., the material's resistance to the penetration) is used to determine the Shore A hardness value. Where the bonding agent existing between the functional and carrier substrates is an elastomer, it is highly desired that it has a Shore A hardness of from 10 to 90, in certain embodiments from 10 to 80, in certain embodiments from 10 to 70, such as from 10 to 60, from 15 to 60, from 10 to 50, from 20 to 50, from 30 to 50, and the like.

Roughness (Ra) is measured using a scanning interferometric microscope which contains a reference surface for which the interferometric fingerprint indicating surface quality is known. To determine a sample's roughness, a lighting source illuminates both the sample and the reference surface. The reflected light from the sample and the reference surface is recombined to give an interferometric fingerprint that depends on the roughness of the sample and is converted into a roughness value in nanometers. It was found that the roughness of surface of the bonding agent bonding to the first surface of the functional substrate at most 183 nm, e.g., at most 180 nm, at most 175 nm, at most 170 nm, at most 160 nm, at most 150 nm, at most 140 nm, at most 130 nm, at most 120 nm, or even at most 110 nm, is particularly advantageous for a desirable bonding between the bonding agent and the functional substrate, which can be substantially lower than a bonding between the bonding agent and the carrier susbstrate formed by polymerization of a pre-prepolymirization layer of the bonding agent. As mentioned supra, the surface roughness of the polymerized layer of the bonding agent can be controlled by the quality of the surface of the pressing substrate used during the step in which the pre-polymerization layer of the bonding agent is polymerized.

Attaching of the first surface of the functional substrate to a polymerized layer of the bonding agent previously bonded to the carrier substrate can be achieved by placing the functional substrate over the surface of the bonding agent. As mentioned supra, absent further treatment, the bond between the bonding agent and the first surface of the functional substrate is in general caused by van der Waals force, and is sufficient but in general weak, which can facilitate the subsequent debonding at the interface between the bonding agent and the functional substrate. The first surface of the functional substrate may be chemically modified by, e.g., the application of a coating layer to either increase or decrease the adhesion between the bonding agent and the functional substrate.

As described supra, preferential debonding at the interface between the surface of the bonding agent and the functional substrate is highly desired in certain embodiments, so that at the end of the debonding step, the bonding agent layer remains attached to the surface of the carrier substrate. However formed, the bond between the bonding agent (such as an elastomer) and the carrier substrate needs to have a peel strength sufficiently high so that the bonding agent layer remains attached to the carrier substrate as the functional substrate is peeled from the elastomer once processing of the carrier substrate—functional substrate assembly has been completed. Quantitatively, the bond between the surface of the bonding agent and the carrier substrate needs to have a peel strength of at least 0.5 kilonewtons/meter when measured at a peeling speed of 20 millimeters/minute and a peeling angle of 90 degrees to achieve this functionality. The peel strength is measured using an INSTRON® machine configured to measure tensile strength. For a given peeling speed and angle, i.e., 20 millimeters/minute and 90 degrees for the interface between the bonding agent layer and the carrier substrate, the tensile load is monitored during measurement and converted into energy.

Once an assembly comprising the functional and the carrier substrates joined by the bonding agent is formed, the second surface of the functional substrate can be processed in a way similar for a single, thick subtrate having the thickness of the assembly. Such processing can include, but is not limited to, thickness reduction, surface modification such as surface polishing, roughening, film deposition, etching, exposure to irradiation, bonding to additional substrates or films, and the like, as well as the fabrication of functional components thereon. Various functional components can be formed on the second surface of the functional substrate. Such functional components can include an optical, mechanical, electrical device or a combination or mixture thereof. Non-limiting examples of optical components include: display; color filter; planar waveguide; planar waveguide components & devicecs; lenses; optical amplifier; multiplexer; demultiplexer; and the like. Non-limiting examples of mechanical components include MEMS; valves; and the like. Non-limiting examples of electrical components include: transistor; diode; capacitor; resistor; inductor; antenna; transceiver; conductor; sensor; photodiode; and combinations and mixtures thereof; and the like. The functional component can be a functional layer of material or a part of it. E.g., the functional layer can be a single layer of silicon (amorphous, polycrystalline or single-crystalline). One having ordinary skill in the relevant art knows the process conditions and materials required for fabricating such functional components on the second surface of the functional substrate. During the step of forming functional components, the assembly may be subjected to high temperature, various chemical solutions, vapors, irradiation at various energy level and dosage, mechanical vibration, mechanical scrubbing, brushing, acceleration and deceleration, and the like. It is highly desired that the material chosen for the bonding agent, and the bonding strength between the bonding agent and the two substrates can withstand such process conditions.

According to the present invention, the debonding of the functional substrate from the carrier substrate is aided by the application of ultrasonic wave to the bonding interface. Depending on the application of the device fabricated, it may be desirable to have the debonding occur primarily at the interface between the bonding agent and the functional substrate, in which case a weaker bond between the bonding agent and the functional substrate is desired, or at the interface between the bonding agent layer and the carrier substrate, in which case a weaker bond between the bonding agent and the carrier substrate is desired, or at both the interfaces, in which case it is desired that the bonds at both sides of the bonding agent layer be sufficiently fragile to be broken in the releasing step. As mentioned supra, in general, it is more desirable to have the debonding occur at the interface between the bonding agent layer and the functional substrate to facilitate the subsequent handling of the functional substrate and to make the reuse and recycle of the carrier substrate having the layer of the bonding agent possible.

The ultrasonic energy may be applied by using typical ultrasonic units. Representative frequencies are 20-400 kHz, such as from 20 to 300 kHz. One option is the ultrasonic cleaning baths. Example equipment is sold by Bransonic and Sonix IV Corporation. A more sophisticated unit is similar to what is included in scanning acoustic microscopes. These are able to sweep frequencies, position, and magnitude of the applied ultrasonic energy. The ultrasonic frequency and power are controlled to target specific depths and areas of the penetrating acoustic beam. In this way, the ultrasonic power can be delivered to the bond layer between the functional subtrate and the carrier substrate. An example of this equipment is sold by Sonix, Inc. Another option is the ultrasonic tools used for dentistry. These produce energy by magnetostriction and provide a stream of localized liquid that transfer the ultrasonic energy. An example vendor for the ultrasonic unit is Bonart Medical Technology.

In a particularly advantageous embodiment, the assembly is placed into a liquid bath to which the ultrasonic wave is applied. The liquid transmits the ultrasonic wave to the bonding interface. Without intending to be bound by a particular theory, it is believed that collapse of microcavitation in the liquid media caused by the application of ultrasonic wave causes the bonding interface to break and the substrate to separate. An exemplary liquid for the bath would be deionized water.

It was found that the surface tension of the liquid media in which the assembly is placed affects the efficacy of the ultrasonic debonding process. Typically, the lower the surface tension of the liquid media in the bath, the more effective the debonding process is. Without intending to be bound by a particular theory, it is believed that the lower the surface tension, the more easily the liquid can wet and penetrate cracks in the bonding interface, and thus the more easily the ultrasonic energy can propagate deeply into the bonding interface, causing a complete breakage and separation. Thus, it would be advantageous to include in the liquid bath a liquid having relatively low surface tension. To that end, ethanol, acetone, mixture of ethanol and acetone, mixture of water and ethanol, mixture of water and acetone, aqueous solutions comprising surfactants, and the like, can be more advangeous for the liquid bath than pure deionized water, given their lower surface tension. Ethanol is a particularly advantageous ultrasound coupling media for a functional substrate intended for opto-electronic applications such as display devices given its compatibility with the materials used in their manufacture process.

In other embodiments, the ultrasonic wave is applied to the carrier/functional substrate assembly via a coupling media other than a liquid bath from a transducer. Such coupling media can be a wave guide, or a liquid applied to a localized area of the assembly, which transmits the ultrasonic wave to a local area of the assembly.

It is desirable that the ultrasonic wave is applied at a higher intensity to the edge area of the assembly because debonding and sepration typically start from the edge of the bonding interface and propagates into the deeper area. To that extent, directional application of ultrasonic wave to the edge area at least at the initial stage of the debonding step is desired. The positioning of this ultrasonic wave can also be adjusted during the separation process to move as the functional substrate debonds from the carrier substrate.

The application of ultrasonic energy to the bonding interface alone can cause the breakage of the bonding interface and the release of the functional substrate and/or the carrier substrate. In alternative embodiments, the application of ultrasonic wave is used in combination with other debonding techniques such as roller debonding, prying, etching, and the like. The application of ultrasonic wave can be done simultaneously with the etching and other mechanical debonding. In other embodiments, the application of ultrasonic wave can be done before mechanical prying and roller debonding or etching. Still in other embodiments, the application of ultrasonic wave can be carried out after a step of etching. In any such embodiments, the application of ultrasonic wave can reduce the intensity of other debonding effort, thus resulting in less mechanical or chemical damage to the functional and/or carrier substrates. Particularly, the application of ultrasonic wave reduces or eliminates the tensile stress caused by mechanical bending or prying, reduces or eliminates the need of chemical etching during debonding, thus can enhance the yield of the debonding step.

The temperature of the assembly, and frequency, direction and the intensity of the ultrasonic wave are all important parameters determining the efficacy of the debonding process. One skilled in the art can choose the functional parameters with some tests based on the teachings of the present disclosure. In general, the higher the temperature, the more effective the debonding tends to be. In addition, temperature can affect the efficacy of other debonding techniques used in conjunction with the application of ultrasound, especially etching.

When a debonding roller is used in the debonding step, or if the substrates are subjected to prying, it is desired that the peeling radius is at least 5 cm, in certain embodiments at least 10 cm, in certain other embodimens at least 20 cm, in certain other embodiments at least 30 cm. The larger the peeling radius, the lower the stress the substrate is subjected to during peeling.

In certain embodiments, during the debonding step, the substrate assembly is placed vertically when ultrasonic wave is applied. In other embodiments, the substrate is placed substantially horizontally during this process. However, to reduce the negative effect of gravity of the substrate on tensile stress during the separation of the functional substrate and/or the carrier substrate from the rest of the assembly, it is desired the assembly is placed substantially vertically when the substrates are being separated from each other, either during or after the application of ultrasonic wave.

Next, the present invention will be further illustrated by referring to the appended drawings.

FIG. 1 schematically illustrates a process of one embodiment according to the present disclosure for fabricating a TFT display. In 1A, a carrier substrate 101 made of a glass substrate having a thickness of about 400 μm is provided. In step (1), a layer of pre-polymerization perfluoropolymer 103 is applied to one major surface of the carrier substrate 101 to result in a structure 1B. In step (2), the layer of pre-polymer 103 is allowed to cure thermally to result in a substantially outgassing-free layer of elastomer 105, which serves as as a layer of bonding agent to bond the carrier substrate to a functional substate to be added later. In step (2), a temporary pressing substrate (not shown) may be used to cover the layer 103 during polymerization and subsequently removed to obtain a polymerized layer 105 having a substantially smooth surface or a surface with a controlled surface roughenss. In step (3), to the top of structure 1C comprising the carrier substrate 101 and the polymerized layer of elastomer 105 is then placed a functional substrate 107 to result in structure 1D. 107 may be a thin glass substrate having a thickness of about 300 μm suitable for fabricating TFT thereon. In subsequent step (4), the opposite surface of substrate 107 is processed to obtain an assembly having structure 1E including a layer 109 comprising TFT and other functional components. Thereafter, in step (5), ultrasonic wave is applied to structure 1E to aid the preferential separation of the functional substrate 107 from the elastomer layer 105 and the carrier substrate 101 (structure 1F). Note in this embodiment, at the end of step (5), the elastomer layer 105 remains bonded to the carrier substrate 101.

Figure 2:
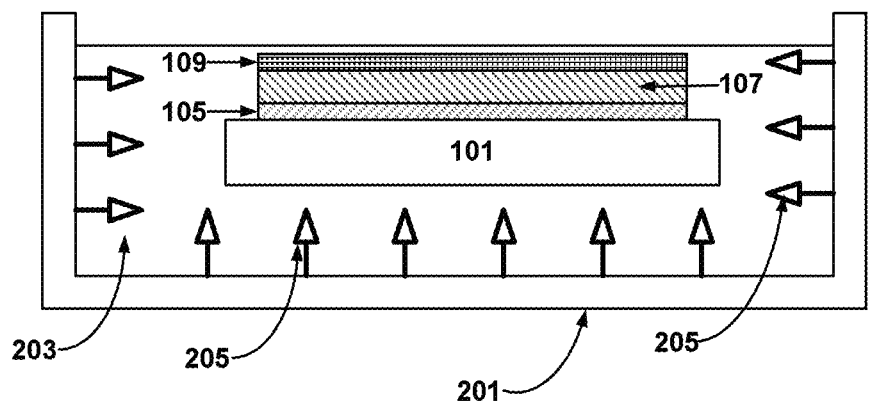
FIG. 2 is a schematic illlutration of the step of applying ultrasonic wave via a liquid bath to an assembly comprising a carrier substrate bonded to a functional substrate via a layer of bonding agent according to one embodiment of the present disclosure.
Figure 3:
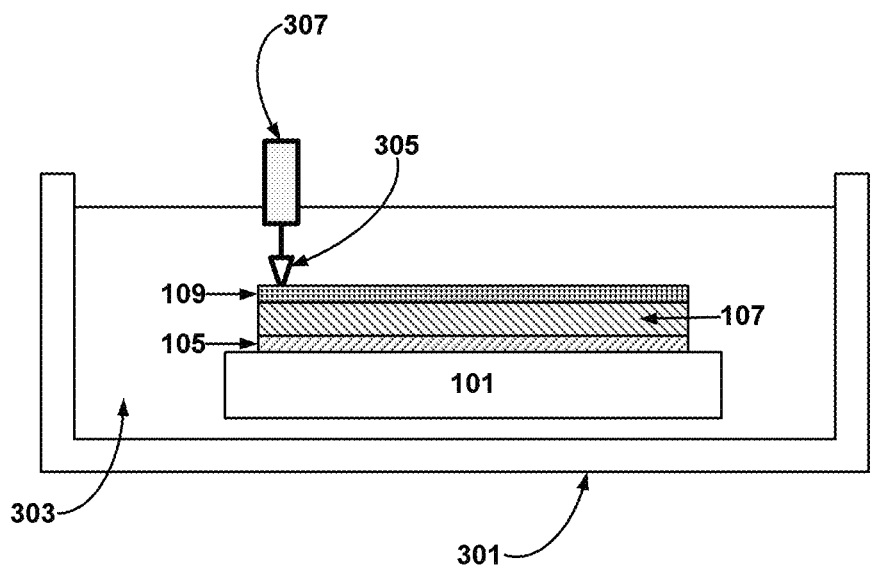
FIG. 3 is a schematic illlutration of the step of applying ultrasonic wave via a liquid bath to an assembly comprising a carrier substrate bonded to a functional substrate via a layer of bonding agent according to another embodiment of the present disclosure.

The application of ultrasonic wave in step (5) of FIG. 1 can be carried out in various ways. In FIG. 2, the full assembly 1E is submerged in a liquid bath comprising, e.g., liquid ethanol 203, in a container 201, to which ultrasonic wave 205 is applied by a transducer from multiple directions via the walls of the container. Such multi-directional application of ultrasonic wave can be transmitted to the bonding interface between the functional substrate 107 and the elastomer layer 105 to achieve a preferential debonding between them. In FIG. 3, the full assembly 1E is submerged in a liquid bath comprising, e.g., liquid ethanol 303 in a container 301, to which ultrasonic wave 305 is applied from a transducer in a more focused manner than is showin in FIG. 2. Such directional application of ultrasonic wave can be transmitted to targeted area of the bonding interface between the functional substrate 107 and the elastomer layer 105 to achieve a preferential debonding between them. The ultrasonic wave 305 can be directed to scan the full area of the bonding interface resulting in a sequential debonding. The ultrasonic wave 305 can be directed through either the functional substrate or the carrier substrate depending on process optimization and compatibility of the functional components 109.

Figure 4:
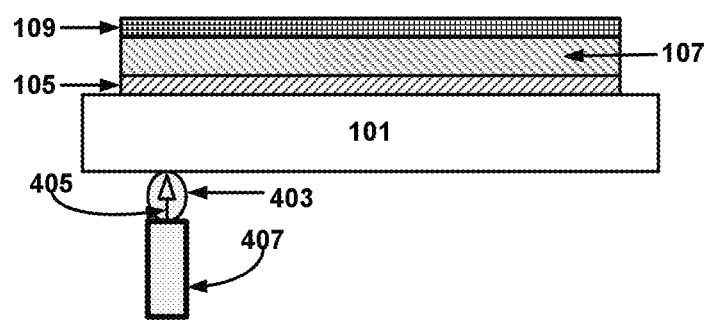
FIG. 4 is a schematic illlutration of the step of applying ultrasonic wave via a waveguide to an assembly comprising a carrier substrate bonded to a functional substrate via a layer of bonding agent according to one embodiment of the present disclosure.

FIG. 4 schematically illustrates an ultrasound-aided debonding process without placing the full assembly 1E in a liquid bath. Instead, the ultrasonic wave 405 is directed from a transducer 407 via the use of a waveguide, such as a liquid media, a coupling agent, and the like, to a targeted area of the bonding interface, from below the carrier substrate. Similar to the embodiment of FIG. 3, the ultrasonic wave beam can be directed to scan the full area of the bonding interface resulting in a sequential debonding without the use of a full, large liquid bath.

Figure 5:
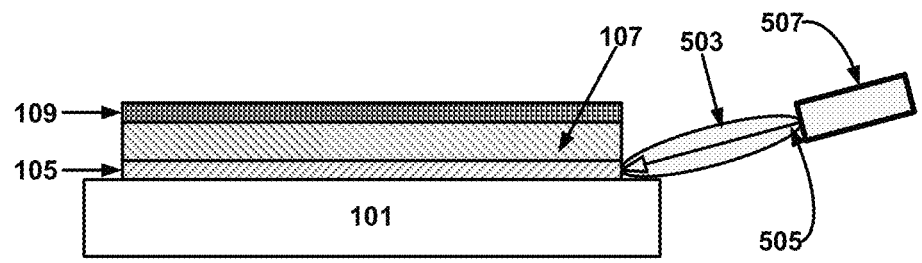
FIG. 5 is a schematic illlutration of the step of applying ultrasonic wave via a waveguide to an assembly comprising a carrier substrate bonded to a functional substrate via a layer of bonding agent according to another embodiment of the present disclosure.

FIG. 5 schematically illustrates an embodiment which is a slight variation of the embodiment of FIG. 4. In FIG. 5, the ultrasound beam is targeted towards the edge area of the bonding interface directly, resulting in a potentially faster debonding initiation from the edge. Similar to FIG. 4, the coupling agent 503 can be a liquid stream.

Figure 6:
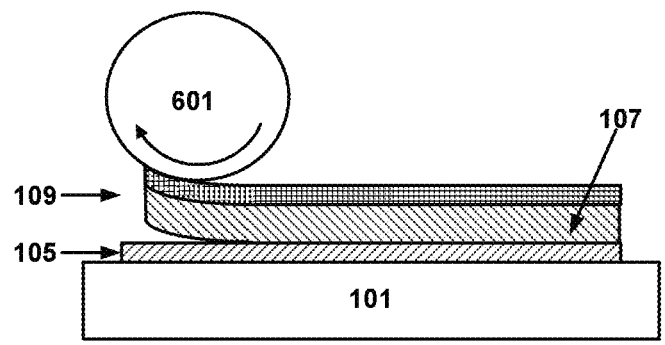
FIG. 6 is a schematic illlutration of the step of peeling a functional substrate away from a carrier substrate bonded thereto via a layer of bonding agent by using a debonding roll according to one embodiment of the present disclosure.

As shown in FIG. 6, during or after the application of ultrasonic wave, the separation of the functional substrate 107 having a surface functional layer 109 can be separated from the elastomer layer 105 and the carrier substrate 101 via the assistance of a debonding roller 601 attached to the surface of 109 via, e.g., an adhesive or vacuum. As can be seen, due to the use of the debonding roller, the substrate 107 and the functional component layer 109 are subject to mechanical tensile stress during debonding, which is reduced due to the use of application of ultrasonic wave either during or prior to the final roller-assisted debonding step.

Figure 7:
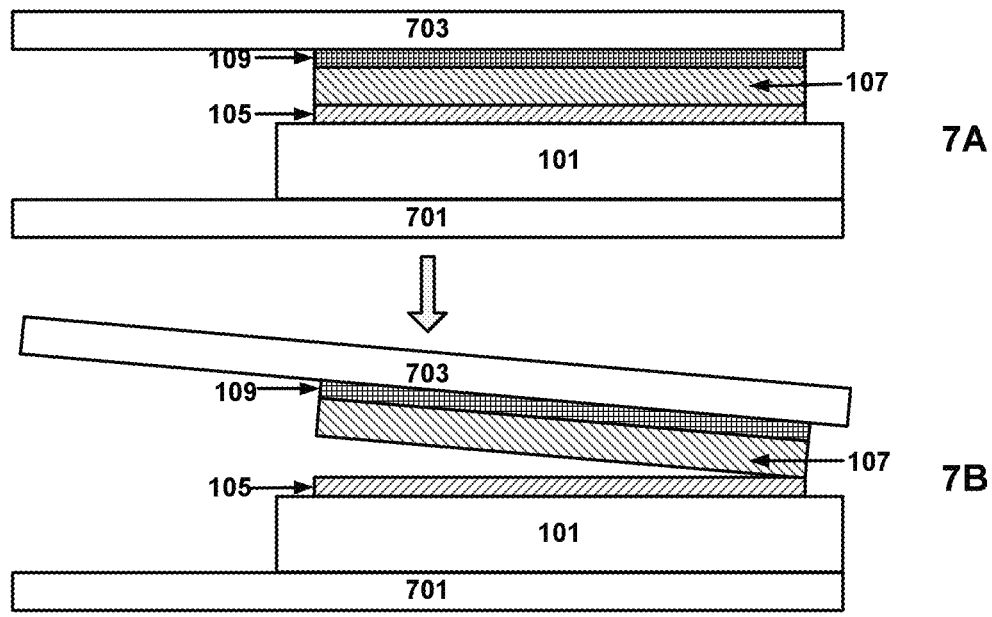
FIG. 7 is a schematic illlutration of the step of prying a functional substrate away from a carrier substrate bonded thereto via a layer of bonding agent by using prying plates bonded to the functional and carrier substrates.

FIG. 7 shows the possibility of using prying plates 701 and 703, temporarily attached to the surfaces of 101 and 109 via double-sided adhesive (in structures 7A and 7B), respectively, to detach the functional substrate 107 from the elastomer layer 105 (in structure 7B). Due to the application of ultrasonic wave to the bonding interface, such prying process is facilitated and made easier than otherwise without the application of ultrasonic wave.

The present invention is further illustrated by the following non-limiting examples.

EXAMPLES

Example 1

Functional substrates temporarily bonded to carrier substrates using a brittle silica inorganic adhesive were exposed to an aggressive ultrasonic bath. Microcracks and liquid penetration into the adhesion layer were observed. This demonstrates that exposure to ultrasonic wave can weaken the bond between the bonding agent and the functional substrate and aid separation.

Example 2

The adhesion strength of a functional substrate temporarily bonded to carrier substrates using an elastomeric adhesive (surface tension $\gamma_S=17$ mJ/m$^2$) was fabricated and tested following the process illustrated in FIG. 1 in a water (surface tension $\gamma_L=72$ mJ/m$^2$) ultrasonic bath with no failure. The same device was tested in acetone, a liquid of lower surface tension ($\gamma_L=23$ mJ/m$^2$) compared to water, and delamination was observed.

It will be apparent to those skilled in the art that various modifications and alterations can be made to the present invention without departing from the scope and spirit of the invention. Thus, it is intended that the present invention cover the modifications and variations of this invention provided they come within the scope of the appended claims and their equivalents.

What is claimed is:

1. A process for making a device comprising a thin functional glass substrate having a first surface, a second surface opposite the first surface, and a thickness T1 between the first surface and the second surface, wherein T1≤500 µm, comprising the following steps:
   (A) bonding the first surface of the functional glass substrate to a carrier substrate having a thickness T2 that is greater than T1 by using a layer of elastomer bonding agent at a bonding interface including an outer periphery circumscribing a bonding area positioned between the first surface of the functional substrate and a bonding surface of the carrier substrate; then
   (B) processing the second surface of the functional substrate; and then
   (C) targeting an ultrasonic wave at a peripheral area of the outer periphery of the bonding interface to initiate debonding at the peripheral area of the bonding interface to achieve a preferential debonding of the layer of elastomer bonding agent from one of the functional glass substrate and the carrier substrate to release the carrier substrate from the functional substrate.

2. A process according to claim 1, wherein the bonding agent used in step (A) comprises at least one of a silicone adhesive and a perfluoro elastomer.

3. A process according to claim 1, wherein the layer of bonding agent is an elastomer having (a) a Shore A hardness in the range of 10 to 90; and (b) a roughness of at most 183 nanometers.

4. A process according to claim 3, wherein the bond between the carrier substrate and the layer of bonding agent has a peel strength of at least 0.5 kilonewtons/meter when measured at a peeling speed of 20 millimeters/minute and a peeling angle of 90°.

5. A process according to claim 1, wherein in step (C), the ultrasonic wave is targeted at the peripheral area of the outer periphery of the bonding interface through a liquid bath.

6. A process according to claim 5, wherein in step (C), the ultrasonic wave is targeted at the peripheral area of the outer periphery of the bonding interface through a liquid bath comprising an organic solvent having a surface tension lower than water at 20° C.

7. A process according to claim 1, wherein step (C) further comprises, after targeting the ultrasonic wave at the peripheral area of the outer periphery of the bonding interface, peeling the functional substrate away from the carrier substrate.

8. A process according to claim 7, wherein during the step of peeling the functional substrate away from the carrier substrate, the peeling radius is at least 5 cm.

9. A process according to claim 1, wherein the functional substrate has a thickness T1 of at most 400 µm.

10. A process according to claim 1, wherein in step (A), the layer of bonding agent at the bonding interface has a thickness of at most 300 µm.

11. A process according to claim 1, wherein step (B) forms a functional component and in step (C), the ultrasonic wave is targeted such that the functional component formed in step (B) is not damaged.

12. A process according to claim 1, wherein the layer of the bonding agent has a stronger adhesion to the carrier substrate than to the functional substrate.

13. A process according to claim 12, wherein at the end of step (C), the carrier substrate remains bonded to the layer of the bonding agent.

14. A process according to claim 1, wherein step (A) comprises:
   (A01) applying a pre-polymerization layer of the bonding agent on a surface of the carrier substrate; and subsequently
   (A02) polymerizing the pre-polymerization layer to obtain a polymerized layer of the bonding agent bonded to the carrier substrate; and
   (A03) placing the first surface of the functional substrate over the polymerized layer of bonding agent to achieve a bond with the functional substrate that is weaker than the bond between the bonding agent and the carrier substrate.

15. A process according to claim 1, wherein step (A) comprises:
   (A11) forming a first layer of a first coating over a surface of the carrier substrate;
   (A12) applying the layer of the bonding agent between the first layer of the first coating and the first surface of the functional state.

16. A process according to claim 15, wherein in step (A11), the first layer of the first coating comprises a silane.

17. A process according to claim 1, wherein after step (C), the carrier substrate bonding to the layer bonding agent is reused in a cycle of processing another functional substrate.

18. A process according to claim 1, wherein the functional substrate comprises multiple layers of glass and polymer such as polyimide.

19. A process according to claim 1, wherein step (C) achieves preferential debonding of the layer of elastomer bonding agent from the functional glass substrate while the layer of elastomer bonding agent remains bonded to the carrier substrate.

20. A process according to claim 1, wherein, after targeting the ultrasonic wave at the peripheral area of the outer periphery of the bonding interface to initiate debonding at the peripheral area of the bonding interface, step (C) further includes directing the ultrasonic wave to scan a full area of the bonding interface to achieve sequential debonding of the carrier substrate from the functional substrate.

21. A process for making a device comprising a thin functional glass substrate having a first surface, a second surface opposite the first surface, and a thickness T1 between the first surface and the second surface, wherein T1≤500 µm, comprising the following steps:
   (A) bonding the first surface of the functional glass substrate to a carrier substrate having a thickness T2 that is greater than T1 by using a layer of elastomer bonding agent at a bonding interface including an outer periphery circumscribing a bonding area positioned between the first surface of the functional substrate and a bonding surface of the carrier substrate; then
   (B) processing the second surface of the functional substrate; and then
   (C) targeting an ultrasonic wave at a peripheral area of the outer periphery of the bonding interface to initiate debonding at the peripheral area of the bonding interface to begin releasing the carrier substrate from the functional substrate.

22. A process according to claim 21, wherein step (C) includes using a waveguide to provide a predetermined travel path for the ultrasonic wave to selectively guide the ultrasonic wave to the peripheral area of the bonding interface.

23. A process according to claim 22, wherein the waveguide comprises a quantity of liquid configured to channel the ultrasonic wave to travel along the predetermined travel path.

24. A process according to claim 1, wherein step (C) releases the entire carrier substrate from the functional glass substrate.

25. A process according to claim 21, wherein after step (C), further comprising step (D) of releasing the entire carrier substrate from the functional glass substrate.

* * * * *